United States Patent
Chen et al.

(10) Patent No.: US 9,978,685 B2
(45) Date of Patent: May 22, 2018

(54) CONFORMAL AMORPHOUS SILICON AS NUCLEATION LAYER FOR W ALD PROCESS

(71) Applicant: Applied Materials, Inc., Santa Clara, CA (US)

(72) Inventors: Yihong Chen, San Jose, CA (US); Kelvin Chan, San Ramon, CA (US); Srinivas Gandikota, Santa Clara, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days. days.

(21) Appl. No.: 15/381,752

(22) Filed: Dec. 16, 2016

(65) Prior Publication Data

US 2017/0179036 A1    Jun. 22, 2017

Related U.S. Application Data

(60) Provisional application No. 62/269,974, filed on Dec. 19, 2015.

(51) Int. Cl.
| | |
|---|---|
| *H01L 21/28* | (2006.01) |
| *H01L 23/532* | (2006.01) |
| *H01L 21/285* | (2006.01) |
| *H01L 21/768* | (2006.01) |
| *H01L 31/18* | (2006.01) |

(52) U.S. Cl.
CPC .. *H01L 23/53266* (2013.01); *H01L 21/28525* (2013.01); *H01L 21/28556* (2013.01); *H01L 21/76861* (2013.01); *H01L 31/18* (2013.01)

(58) Field of Classification Search
CPC ... H01L 23/53; H01L 23/532; H01L 23/5326; H01L 23/53266; H01L 21/28; H01L 21/285; H01L 21/2852; H01L 21/2855; H01L 21/28556; H01L 21/28525; H01L 21/76; H01L 21/768; H01L 21/7686; H01L 21/76861; H01L 31/18
USPC .......................................................... 257/773
See application file for complete search history.

(56) References Cited

U.S. PATENT DOCUMENTS

| | | | |
|---|---|---|---|
| 5,726,094 A | 3/1998 | Schwalke et al. |
| 5,805,973 A | 9/1998 | Coffinberry et al. |
| 6,323,126 B1 | 11/2001 | Chittipeddi et al. |
| 6,352,755 B1 | 3/2002 | Finley et al. |
| 6,492,694 B2 | 12/2002 | Noble et al. |
| 6,642,092 B1 | 11/2003 | Voutsas et al. |
| 6,730,584 B2 | 5/2004 | Schuegraf et al. |

(Continued)

FOREIGN PATENT DOCUMENTS

| | | |
|---|---|---|
| JP | 2007297150 A | 11/2007 |
| KR | 1020040040858 A | 5/2004 |

(Continued)

OTHER PUBLICATIONS

PCT International Search Report and Written Opinion in PCT/US2016/067204 dated May 29, 2017, 10 pages.

*Primary Examiner* — Monica D Harrison
(74) *Attorney, Agent, or Firm* — Servilla Whitney LLC

(57) ABSTRACT

Methods for depositing a metal film comprising forming an amorphous silicon layer as a nucleation layer and/or glue layer on a substrate. Some embodiments further comprise the incorporation of a glue layer to increase the ability of the amorphous silicon layer and metal layer to stick to the substrate.

15 Claims, 2 Drawing Sheets

(56) References Cited

U.S. PATENT DOCUMENTS

| | | | |
|---|---|---|---|
| 6,849,471 | B2 | 2/2005 | Patel et al. |
| 7,208,354 | B2 | 4/2007 | Bauer |
| 7,544,576 | B2 | 6/2009 | Jawarani et al. |
| 7,630,114 | B2 | 12/2009 | Wang et al. |
| 8,697,533 | B2 | 4/2014 | Herner |
| 8,766,260 | B2 * | 7/2014 | Kishida ............... H01L 29/7866 257/57 |
| 8,883,603 | B1 | 11/2014 | Maxwell |
| 2012/0012170 | A1 | 1/2012 | Foss et al. |
| 2012/0309205 | A1 | 12/2012 | Wang et al. |
| 2015/0263124 | A1 * | 9/2015 | Yamaguchi ......... H01L 29/4966 257/411 |

FOREIGN PATENT DOCUMENTS

| | | |
|---|---|---|
| WO | 00/06795 A1 | 2/2000 |
| WO | 2009082517 A1 | 7/2009 |

* cited by examiner

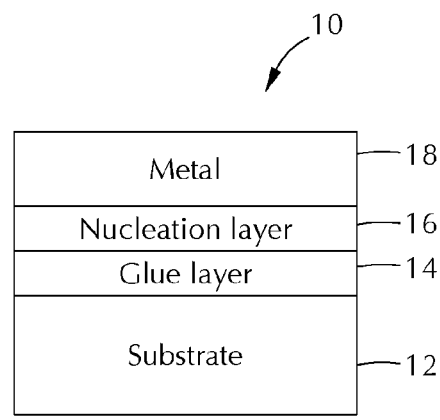
FIG. 1
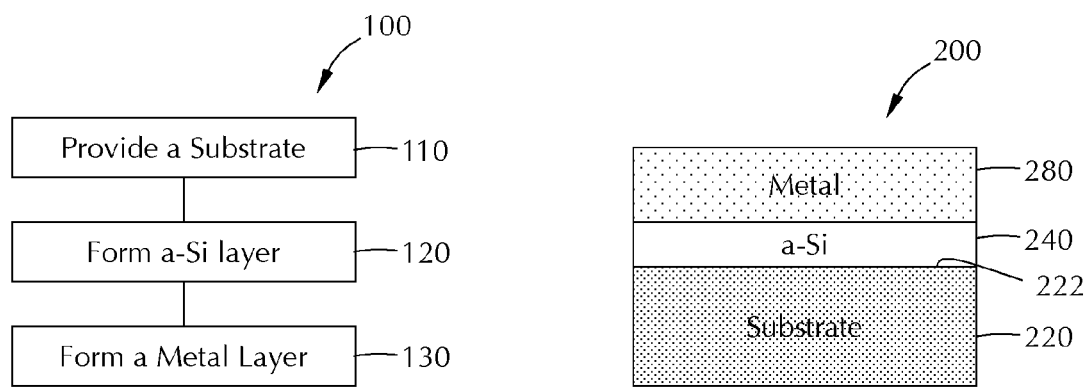
FIG. 2A
FIG. 2B

CONFORMAL AMORPHOUS SILICON AS NUCLEATION LAYER FOR W ALD PROCESS

CROSS-REFERENCE TO RELATED APPLICATIONS

This application claims priority to U.S. Provisional Application No. 62/269,974, filed Dec. 19, 2015, the entire disclosure of which is hereby incorporated by reference herein.

TECHNICAL FIELD

The present disclosure relates generally to methods of depositing thin films. In particular, the disclosure relates to processes for the deposition of films comprising amorphous silicon.

BACKGROUND

Amorphous silicon is widely used in semiconductor devices, flat-panel displays, and solar cells. There remains a key technical challenge for the development of amorphous silicon deposition process with conformality (i.e., good step coverage) or gap-fill performance in high aspect-ratio features. Conventional LPCVD process is limited to high temperature (>550° C.) and low pressure, and, therefore, exhibits poor step coverage and/or gap-fill performance; PECVD process also does not give good step coverage and/or gap-full performance.

The atomic layer deposition (ALD) of tungsten thin films exhibits very long incubation delay's on silicon, silicon dioxide and titanium nitride services due to poor nucleation performance. A nucleation layer is usually used to mitigate this issue. Conventionally, ALD $WSi_x$ or $WB_x$ is deposited by $WF_6/Si_2H_6$ and $WF_6/B_2H_6$, respectively. However, $WF_6$ is directly exposed to the substrate surface (e.g., Si, $SiO_2$) and damages the substrate.

Additionally, ALD tungsten films do not stick well directly on silicon or silicon oxide substrate surfaces. A titanium nitride glue layer is used to improve the adhesion. However, both the titanium nitride glue layer and $WSi_x/WB_x$ nucleation layer do not conduct well, resulting in a very high resistivity for the stack ($W/WSi_x/TiN$).

Therefore, there is a need in the art for methods of depositing metal films with high conformality.

SUMMARY

One or more embodiments of the disclosure are directed to processing methods comprising exposing a substrate surface to a silicon precursor to form an amorphous silicon layer having a thickness. A metal layer is formed on the amorphous silicon layer.

Additional embodiments of the disclosure are directed to stacks comprising a substrate having an oxide surface. A glue layer is on the oxide surface. The glue layer comprises TiN with a thickness in the range of about 5 Å to about 30 Å. An amorphous silicon layer is on the glue layer and has a thickness in the range of about 5 Å to about 50 Å. A metal layer is on the amorphous silicon layer and comprises one or more of tungsten and molybdenum.

Further embodiments of the disclosure are directed to processing methods comprising providing a silicon substrate having a silicon oxide surface. A glue layer is formed on the silicon substrate. The glue layer comprises TiN with a thickness in the range of about 1 Å to about 30 Å. An amorphous silicon layer is formed on the glue layer by exposing the glue layer to a silicon precursor comprising disilane. The amorphous silicon layer has a thickness in the range of about 30 Å to about 40 Å. A metal layer is formed on the amorphous silicon layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 shows schematic of a film stack in accordance with one or more embodiment of the disclosure;

FIG. 2A shows a process scheme in accordance with one or more embodiment of the disclosure;

FIG. 2B shows a schematic of a film stack in accordance with the process scheme of FIG. 2A;

DETAILED DESCRIPTION

Figure 3:
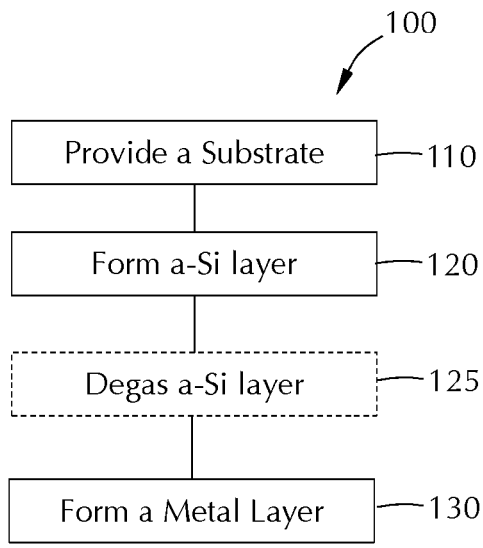
FIG. 3 shows a process scheme in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

One or more embodiments of the disclosure are directed to methods of depositing a conformal amorphous silicon thin film as one or more of a glue layer, a fluorine diffusion barrier and/or a nucleation layer for metal ALD (e.g., tungsten deposition). While tungsten deposition is referred to in many embodiments, those skilled in the art will understand that other metals (e.g., Mo) could be deposited by the disclosed process. The disclosure is not limited to ALD tungsten deposition.

Embodiments of the disclosure include process integration schemes for metal ALD processes. For example, tungsten deposited by atomic layer deposition on a silicon substrate. With reference to FIG. 1, a stack 10 may include a substrate 12 (e.g., $SiO_2$) with a glue layer 14 (e.g., TiN), a nucleation layer 16 (e.g., $WSi_x$ and $WB_x$) and a metal 18 (e.g., W). In one or more embodiment of a process scheme, a nucleation layer is replaced with an amorphous silicon layer. In some embodiments, the nucleation layer is replaced with an amorphous silicon layer and the TiN glue layer is made thinner. In one or more embodiments, both the nucleation layer and glue layer are replaced with an amorphous silicon layer.

With reference to FIGS. 2A and 2B, one or more embodiments of the disclosure are directed processing methods 100 and film stacks 200. A substrate 220 having a substrate surface 222 is provided in step 110. In step 120, the substrate 220 exposed to a silicon precursor to form an amorphous silicon layer 240 on the substrate surface 222.

In some embodiments, the amorphous silicon (a-Si) formation can be achieved by maximizing the partial pressure of the silicon precursor while minimizing the wafer temperature. Suitable silicon precursors include, but are not limited to, poly-silanes ($Si_xH_y$). For example, poly-silanes include disilane ($Si_2H_6$), trisilane ($Si_3H_8$), tetrasilane ($Si_4H_{10}$), isotetrasilane, neopentasilane ($Si_5H_{12}$), cyclopentasilane ($Si_5H_{10}$), hexasilane ($Si_6H_{14}$), cyclohexasilane ($Si_6H_{12}$) or, in general, $Si_xH_y$ with x=2 or more, and combinations thereof. For example, disilane, which has a moderate processing temperature and high vapor pressure, may be used as the silicon precursor alone or in combination with other species.

In some embodiments, the silicon precursor comprises substantially only disilane. As used in this specification and the appended claims, the phrase "substantially only disilane" means that at least 95% of the active species is disilane. Other gases, such as carrier gases and inert gases, can be included in any amount.

The thickness of the amorphous silicon layer 240 can vary depending on, for example, the substrate surface and subsequent films and processes. In some embodiments, the amorphous silicon layer 240 has a thickness in the range of about 1 Å to about 100 Å. In one or more embodiments, the amorphous silicon layer 240 has a thickness in the range of about 1 Å to about 50 Å, or in the range of about 10 Å to about 40 Å, or in the range of about 30 Å to about 40 Å. In some embodiments, the thickness of the amorphous silicon layer 240 is greater than 0 Å and less than or equal to about 50 Å, 45 Å or 40 Å.

A metal layer 280 is formed on the amorphous silicon layer 240 in step 130. The metal layer 280 can be formed by any suitable technique including, but not limited to, atomic layer deposition (ALD), plasma-enhanced atomic layer deposition (PE-ALD), chemical vapor deposition (CVD), plasma-enhanced chemical vapor deposition (PE-CVD) and physical vapor deposition (PVD).

The metal layer 280 can comprise any suitable metal. In some embodiments, the metal layer 280 comprises one or more of tungsten or molybdenum. In some embodiments, the metal layer 280 consists essentially of tungsten. In some embodiments, the metal layer 280 consists essentially of molybdenum. As used in this regard, "consists essentially of" means that the metal layer 280 is greater than or equal to about 80, 85, 90 or 95 atomic % of the specified component. For example, a metal layer 280 consisting essentially of tungsten has a composition that is greater than or equal to about, for example, 90 atomic % tungsten.

In some embodiments, the metal layer 280 is deposited by CVD. A metal precursor and a reactant may be coflowed into a processing chamber to deposit a layer on the substrate. The precursor and reactant are allowed to react in the gas phase.

In some embodiments, the metal layer 280 is deposited by ALD. In a time-domain ALD process, the metal precursor is flowed into the processing chamber to react with the surface. The chamber is purged of excess precursor and byproducts and the reactant is flowed into the chamber. The precursor and reactant are not in the processing chamber at the same time so there is minimal or no gas phase reactions. In a spatial ALD process, the metal precursor is flowed into a first section of a processing chamber and the reactant is simultaneously flowed into a second section of the processing chamber. The first section and second section are separated by a gas curtain to prevent gas phase reactions between the precursor and reactant. The substrate is moved between the first section and the second section to sequentially expose the surface to the precursor and reactant. In some embodiments, the metal layer 280 is deposited by sequentially exposing the amorphous silicon layer 240 to a metal precursor and a reactant.

The metal precursor can be any suitable precursor that can be used to deposit a metal film. In some embodiments, the metal precursor comprises a metal selected from tungsten, molybdenum and combinations thereof. In one or more embodiments, the metal precursor comprises one or more of $WF_6$ and $MoF_6$. In some embodiments, the metal precursor is a fluorine containing precursor. It is known that fluorine may etch silicon surface. Some embodiments of the disclosure advantageously allow the use of fluorine precursors because the amorphous silicon layer 240 can be formed to a thickness sufficient to ensure that the precursor does not remove all of the a-Si film.

The reactant can be any suitable reactant that is able to react with a species formed on the surface. For example, if $WF_6$ is used as the precursor, there will be —$WF_x$ species on the surface. The reactant is able to react with the —$WF_x$ species to produce a W film.

FIG. 3 shows a process flow for another embodiment of the disclosure in which a degas process 125 is included after formation of the amorphous silicon layer 240. The amorphous silicon layer 240 in some embodiments is exposed to a degas environment to remove outgassed species prior to forming the metal layer 280.

The deposited amorphous silicon layer 240 may evolve or outgas a species, for example, hydrogen. The degas environment provides an opportunity for the gaseous species to evolve, minimizing bubbling of the final film. The degas environment can include any condition with allows or encourages degassing of the film. For example, the degas environment may consists essentially of an inert gas. As used in this regard, "consists essentially of" means that there is no gaseous species that interfere with the outgassing of the deposited film. Other reactive species may be present without inhibiting degassing of the film while still consisting essentially of an inert gas.

Suitable inert gases include, but are not limited to, one or more of argon, helium, nitrogen, and/or mixtures thereof.

In one or more embodiments, the outgassed species comprises hydrogen, $SiH_2$, $SiH_3$, $SiH_4$, and/or other low-order silanes.

The pressure in the processing chamber, or region of the processing chamber can be independently controlled for the precursor exposure and degas environment. In some embodiments, exposure to each of the silicon precursor and the degas environment occurs at a pressure in the range of about 10 mTorr to about 100 Torr. In some embodiments, the silicon precursor is exposed to the substrate at a pressure greater than or equal to about 500 mTorr, or greater than or equal to about 1 Torr, or greater than or equal to about 5 Torr, or greater than or equal to about 10 Torr, or greater than or equal to about 20 Torr, or greater than or equal to about 30 Torr.

The temperature at which the substrate surface is exposed to the precursor or degas environment can be varied depending on, for example, the thermal budget of the device being formed and the precursor. In some embodiments, exposure to each of the precursor and the degas environment occurs at a temperature in the range of about 100° C. to about 700° C. In one or more embodiments, the silicon halide precursor is exposed to the substrate at a temperature in the range of about 250° C. to about 600° C., or in the range of about 400° C. to about 550° C.

The thickness of the a-Si film formed with the silicon precursor before exposure to the degas environment can be modified. In some embodiments, each exposure to the silicon precursor and the degas environment grows a film with a thickness in the range of about 5 Å to about 20 Å.

The precursor and degas environments can be repeatedly sequentially exposed to the substrate surface to form a film with a predetermined thickness. In some embodiments, the amorphous silicon film has a total thickness in the range of about 100 Å to about 1 µm.

In some embodiments, a-Si is deposited by disilane at a wafer temperature less than about 450° C., and disilane partial pressure is greater than or equal to about 20 Torr. In an exemplary embodiment, the substrate is exposed to the silicon precursor at a pressure greater than or equal to about 20 Torr at a temperature in the range of about 400° C. to about 550° C.

Figures 4A, 4B:
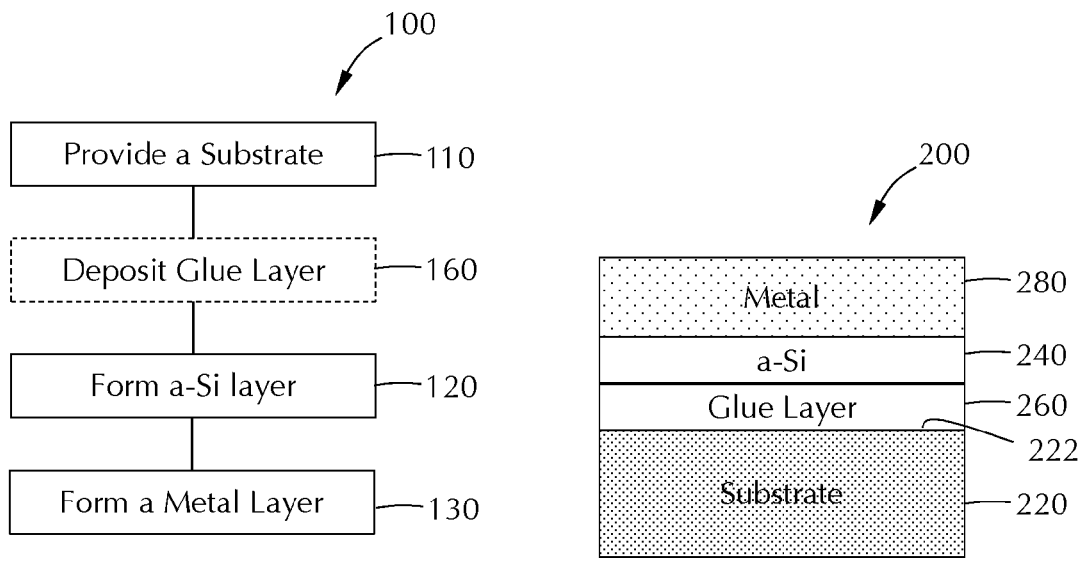
FIG. 4A shows a process scheme in accordance with one or more embodiment of the disclosure.
FIG. 4B shows a schematic of a film stack in accordance with the process scheme of FIG. 4A.

Referring to FIGS. 4A and 4B, some embodiments of the disclosure further comprise step 160 in which a glue layer 260 is deposited on the substrate before forming the amorphous silicon layer 240. The glue layer 260 is a layer that the amorphous silicon can stick to with less likelihood of peeling than if the amorphous silicon layer was deposited directly onto the substrate 220. In some embodiments, the glue layer comprises TiN. In one or more embodiments, the substrate 220 has a silicon oxide surface and the glue layer comprises TiN.

The thickness of the glue layer 260 can vary depending on the substrate and the thickness of amorphous silicon to be deposited. In some embodiments, the glue layer 260 has a thickness in the range of about 1 Å to about 30 Å, or in the range of about 5 Å to about 30 Å. In some embodiments, the glue layer 260 has a thickness less than or equal to about 20 Å, or less than or equal to about 15 Å or less than or equal to about 10 Å or less than or equal to about 5 Å.

Referring to FIG. 4B, one or more embodiments of the disclosure are directed to stacks 200 comprising a substrate 220 having an oxide surface 222. A glue layer 260 is on the oxide surface 222. The glue layer of some embodiments comprises TiN with a thickness in the range of about 5 Å to about 30 Å. An amorphous silicon layer 240 is on the glue layer 260 and has a thickness in the range of about 5 Å to about 50 Å. A metal layer 280 is on the amorphous silicon layer 240 and comprises one or more of tungsten and molybdenum.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
exposing a substrate surface to a silicon precursor to form an amorphous silicon layer having a thickness; and
forming a metal layer on the amorphous silicon layer, the metal layer comprises one or more of tungsten or molybdenum, the metal layer formed by sequentially exposing the amorphous silicon layer to a metal precursor and a reactant, the metal precursor comprising one or more of $WF_6$ or $MoF_6$ and the reactant comprising hydrogen.

2. The method of claim 1, wherein the silicon precursor comprises a poly-silane.

3. The method of claim 2, wherein the poly-silane comprises one or more of disilane, trisilane, tetrasilane, isotetrasilane, neopentasilane, cyclopentasilane, hexasilane or cyclohexasilane.

4. The method of claim 2, wherein the silicon precursor comprises substantially only disilane.

5. The method of claim 1, further comprising exposing the amorphous silicon layer to a degas environment to remove outgassed species prior to forming the metal layer.

6. The method of claim 5, wherein the degas environment consists essentially of an inert gas.

7. The method of claim 6, wherein the inert gas comprises one or more of argon, helium and nitrogen.

8. The method of claim 1, wherein the thickness of the amorphous silicon layer is in the range of about 1 Å to about 100 Å.

9. The method of claim 1, further comprising depositing a glue layer on the substrate before forming the amorphous silicon layer.

10. The method of claim 9, wherein the glue layer comprises TiN.

11. The method of claim 10, wherein the substrate surface comprises silicon oxide.

12. The method of claim 11, wherein the TiN layer has a thickness in the range of about 5 Å to about 30 Å and the amorphous silicon layer has a thickness in the range of about 5 Å to about 50 Å.

13. A processing method comprising:
providing a silicon substrate having a silicon oxide surface;
forming a glue layer on the silicon substrate, the glue layer comprising TiN with a thickness in the range of about 1 Å to about 30 Å;
forming an amorphous silicon layer on the glue layer by exposing the glue layer to a silicon precursor comprising disilane, the amorphous silicon layer having a thickness in the range of about 30 Å to about 40 Å; and
forming a metal layer on the amorphous silicon layer, the metal layer comprising one or more of tungsten or molybdenum, the metal layer formed by sequentially exposing the amorphous silicon layer to a metal precursor and a reactant, the metal precursor comprising one or more of $WF_6$ or $MoF_6$ and the reactant comprising hydrogen.

14. The method of claim 13, further comprising exposing the amorphous silicon layer to a degas environment to remove outgassed species prior to forming the metal layer.

15. The method of claim 14, wherein the degas environment consists essentially of an inert gas.

* * * * *